United States Patent
Askar

(10) Patent No.: US 11,340,786 B2
(45) Date of Patent: May 24, 2022

(54) APPARATUS AND METHODS FOR SYNCHRONIZING A PLURALITY OF DOUBLE DATA RATE MEMORY RANKS

(71) Applicant: Advanced Micro Devices, Inc., Santa Clara, CA (US)

(72) Inventor: Tahsin Askar, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 17/095,221

(22) Filed: Nov. 11, 2020

(65) Prior Publication Data

US 2022/0057937 A1 Feb. 24, 2022

Related U.S. Application Data

(60) Provisional application No. 63/069,327, filed on Aug. 24, 2020.

(51) Int. Cl.
| | |
|---|---|
| *G06F 12/0802* | (2016.01) |
| *G06F 3/06* | (2006.01) |
| *G06F 1/12* | (2006.01) |
| *G11C 7/22* | (2006.01) |

(52) U.S. Cl.
CPC .............. *G06F 3/0604* (2013.01); *G06F 1/12* (2013.01); *G06F 3/0655* (2013.01); *G06F 3/0673* (2013.01); *G11C 7/222* (2013.01)

(58) Field of Classification Search
CPC ........ G06F 3/0604; G06F 1/12; G06F 3/0655; G06F 3/0673
See application file for complete search history.

(56) References Cited

U.S. PATENT DOCUMENTS

| | | | |
|---|---|---|---|
| 2013/0083611 A1* | 4/2013 | Ware ..................... | G06F 3/0673 365/191 |
| 2014/0314190 A1* | 10/2014 | Chalasani ................ | G06F 1/08 375/355 |
| 2017/0004869 A1 | 1/2017 | Shin et al. | |

OTHER PUBLICATIONS

Brett Murdock, Advantages of LPDDR5: A New Clocking Scheme, Semiconductor Engineering, URL: https://semiengineering.com/advantages-of-lpddr5-a-new-clocking-scheme/, dated Sep. 5, 2019, 17 pages.

(Continued)

*Primary Examiner* — Ajay Ojha

(57) ABSTRACT

A shared data transfer clock is used among double data rate memory ranks. A memory controller processes incoming memory access commands destined for at least one of a plurality of double data rate memory ranks and determines when a target DDR memory rank is out of synchronization with respect to the shared data transfer clock and a memory clock. In response to determining that the target DDR memory rank is out of synchronization, the memory controller determines whether the non-target DDR memory rank is out-of-synchronization with respect to the shared data transfer clock and the memory clock, and issues a data transfer clock synchronization command to the target DDR memory rank in response to determining that the non-target DDR memory rank is out-of-synchronization with respect to the shared data transfer clock and the memory clock.

22 Claims, 9 Drawing Sheets

(56) References Cited

OTHER PUBLICATIONS

Ha et al., A 7.5Gb/s/pin LPDDR5 SDRAM with WCK Clocking and Non-Target ODT for High Speed and with DVFS, Internal Data Copy, and Deep-Sleep Mode for Low Power, ISSCC 2019, IEEE International Solid-State Circuits Conference, Digest of Technical Papers, Session 23, DRAM, 23.1, DOI: 10.1109/ISSCC.2019.8662509, dated Feb. 20, 2019, 3 pages.
International Search Report and Written Opinion, PCT/US2021/047236, Dec. 21, 2021, 15 pages.

* cited by examiner

APPARATUS AND METHODS FOR SYNCHRONIZING A PLURALITY OF DOUBLE DATA RATE MEMORY RANKS

RELATED APPLICATIONS

This application claims priority to Provisional Application Ser. No. 63/069,327, filed on Aug. 24, 2020, having inventor Tahsin Askar, titled "APPARATUS AND METHODS FOR SYNCHRONIZING A PLURALITY OF DOUBLE DATA RATE MEMORY RANKS", and is incorporated herein by reference.

BACKGROUND OF THE DISCLOSURE

Computer systems typically use inexpensive and high-density dynamic random access memory (DRAM) chips for main memory. Most DRAM chips sold today are compatible with various double data rate (DDR) DRAM standards promulgated by the Joint Electron Devices Engineering Council (JEDEC). DDR DRAMs offer both high performance and low power operation by providing various low power modes. For example, Low-Power Double Data Rate Dynamic Random Access Memory (LPDDR DRAM) is designed to consume less power than other types of memory and finds use in mobile devices and non-mobile devices. For example, LPDDR memory is used in data processing systems employing high density dynamic random access memories such as cloud computing servers, desktop computers, laptop computers, mobile devices, printers and other devices. A new $5^{th}$ generation LPDDR memory referred to as LPDDR5 is designed to have improved power consumption and improved data transfer speed compared to prior generations. One improvement for reduced power consumption is a type of deep sleep mode that can be set during idle modes of a memory.

Modern DDR memory controllers communicate with DDR memory chips through individual dedicated physical (PHY) layer interface circuits. Each DDR memory chip or group of chips is also referred to as a rank. In systems that employ LPDDR5 memories, each rank may be individually connected to a respective physical layer chip or circuit. Each physical layer interface circuit provides a separate bus structure to each DDR memory. This includes a separate write clock signal (WCK), also referred to as a data transfer clock, that serves as a type of reference clock so that each rank is connected to and receives the separate data transfer clock. The write clock signal must be synchronized with a memory clock of a rank to perform read and write operations. Synchronization commands are sent from a memory controller to synchronize a write clock from a physical layer interface circuit and corresponding memory clock used by the particular rank. Such multi-bus configurations can result in high cost systems.

BRIEF DESCRIPTION OF THE DRAWINGS

The implementations will be more readily understood in view of the following description when accompanied by the below figures, wherein like reference numerals represent like elements, and wherein.

Figure 1:
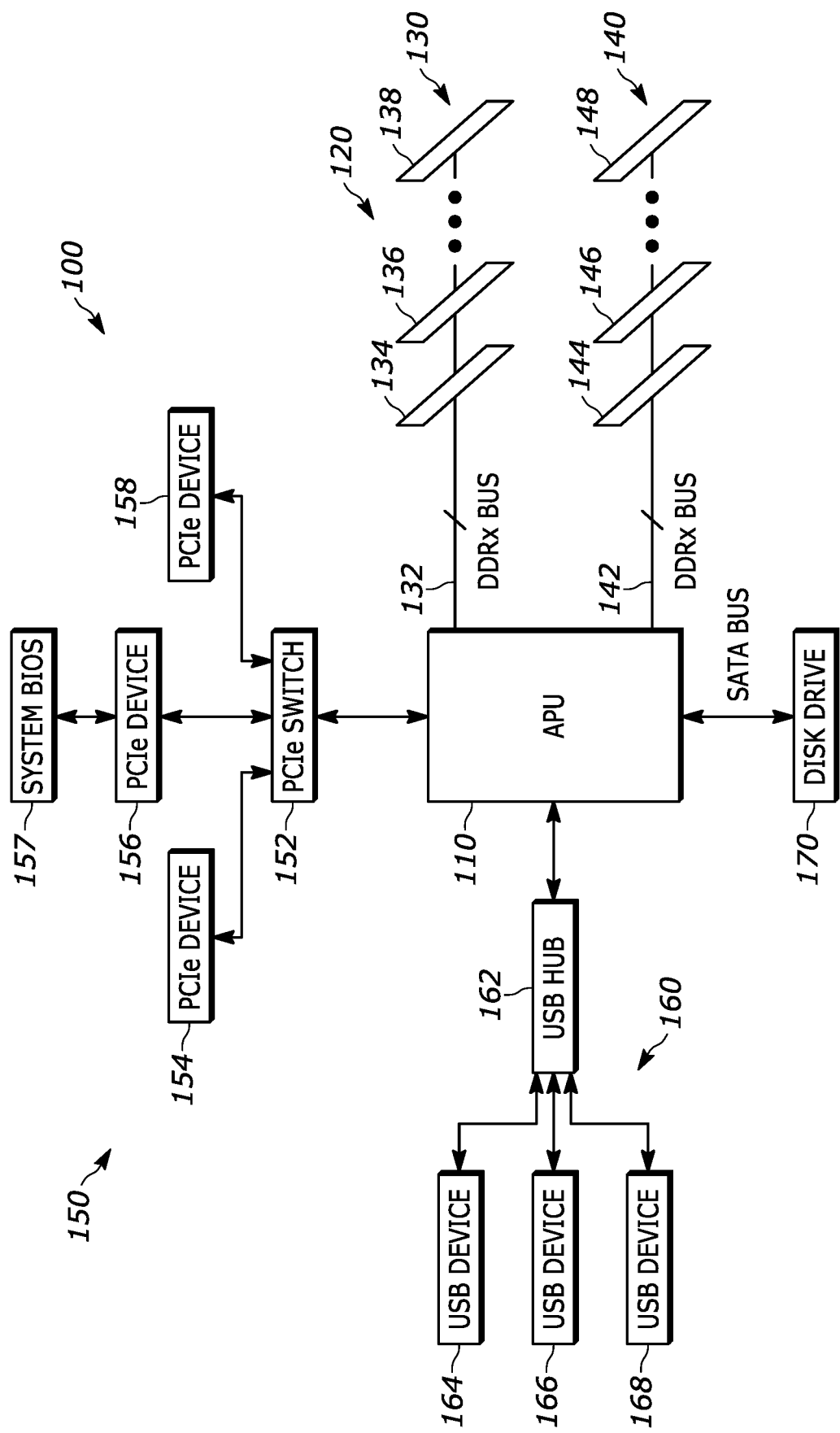
FIG. 1 illustrates in block diagram of a data processing system according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF IMPLEMENTATIONS

Briefly, apparatus and methods for synchronizing a plurality of double data rate memory ranks employs a shared data transfer clock, such as a write clock (e.g., LPDDR5 JEDEC specified WCK), that is coupled to multiple double data rate memory ranks, such as LPDDR5 JEDEC compliant memory ranks, or other suitable types of memory ranks. In some implementations, a shared bus structure is employed such that a single physical layer interface interfaces with multiple different memory ranks instead of using individual PHY interface circuits and bus paths for each rank. In certain examples, the physical layer interface circuit when embodied as an integrated circuit chip, employs a fewer number of pins and uses a single data transfer clock pin that is connected to multiple DDR memory ranks.

In some implementations, a memory controller issues data transfer synchronization commands to a plurality of double data rate memory ranks that share a data transfer signal (e.g., WCK) from a same physical layer interface circuit, by waiting for a non-target memory rank to become out of synchronization with a memory clock provided by the physical layer interface circuit. In some examples, a memory rank is one or more DRAM ranks connected to the same rank select, and therefore accessed simultaneously. In some examples, the memory controller waits to issue a data transfer clock synchronization command to a target double data rate memory rank until a determination is made that the non-target double data rate memory rank transitioned or will transition from in-synchronization to out-of-synchronization with the memory clock.

According to certain implementations, a method for synchronizing a plurality of double data rate memory ranks includes determining when a target DDR memory rank is out of synchronization with respect to a shared data transfer clock and a memory clock, wherein the shared data transfer clock is connected as shared among the target DDR memory clock and a non-target DDR memory rank; and determining when the target DDR memory rank is out of synchronization with respect to the shared data transfer clock and the memory clock. In response to determining that the target DDR memory rank is out of synchronization with respect to the shared data transfer clock and the memory clock, the method includes determining whether the non-target DDR memory rank is out-of-synchronization with respect to the shared data transfer clock and the memory clock, and issuing a data transfer clock synchronization command to the target DDR memory rank in response to determining that the non-target DDR memory rank is out-of-synchronization with respect to the shared data transfer clock and the memory clock. In some examples the method includes providing the shared data transfer clock to the target double data rate (DDR) memory rank and the non-target DDR memory rank.

According to some examples, in response to determining that the target double data rate memory rank is out of synchronization, the method includes determining whether the non-target double data rate memory rank is in synchronization with the memory clock, and in response to determining that the non-target double data rate memory rank is in synchronization with the memory clock, determining a rank synchronization switch occasion for the non-target double data rate memory rank indicating a transition from an in-synchronization condition to an out-of-synchronization condition with the memory clock, and issuing the data transfer clock synchronization command to the target double data rate memory rank in response to determining the rank synchronization switch occasion for the non-target double data rate memory rank.

According to some implementations, the method includes maintaining a read synchronization counter and a write synchronization counter for each of the target double data rate memory rank and the non-target double data rate memory rank, and issuing the data transfer clock synchronization command based on the maintained read synchronization counter and the write synchronization counter for each of the target double data rate memory rank and the non-target double data rate memory rank.

According to other implementations, a unified synchronization counter per memory is used and maintained for each of the target double data rate memory rank and the non-target double data rate memory rank and the data transfer clock synchronization command is issued based on the maintained unified synchronization counter for each memory rank.

According to some examples, the method includes placing the non-target DDR memory rank in a reduced power mode, arbitrating among incoming memory access commands destined for the target DDR memory rank while the non-target DDR memory rank is in the reduced power mode, detecting that the non-target DDR memory rank is required to come out of the reduced power mode, pausing the arbitrating among incoming memory access commands destined for the target DDR memory rank, letting the target DDR memory rank become out-of-synchronization, removing the non-target DDR memory rank from the reduced power mode, and resuming the arbitrating among incoming memory access commands destined for the target DDR memory rank.

In certain implementations, a device includes a memory controller that processes incoming memory access commands destined for at least one of a plurality of double data rate memory ranks and determines when the target DDR memory rank is out of synchronization with respect to the shared data transfer clock and a memory clock. In response to determining that the target DDR memory rank is out of synchronization with respect to the shared data transfer clock and the memory clock, the memory controller determines whether the non-target DDR memory rank is out-of-synchronization with respect to the shared data transfer clock and the memory clock, and issues a data transfer clock synchronization command to the target DDR memory rank in response to determining that the non-target DDR memory rank is out-of-synchronization with respect to the shared data transfer clock and the memory clock.

In some examples, the memory controller, in response to determining that the target double data rate memory rank is out of synchronization, determines whether the non-target double data rate memory rank is in synchronization with the memory clock, and in response thereto, determines a rank synchronization switch occasion for the non-target double data rate memory rank indicating a transition from an in-synchronization condition to an out-of-synchronization condition with the memory clock, and issues the data transfer clock synchronization command to the target double data rate memory rank in response to determining the rank synchronization switch occasion for the non-target double data rate memory rank.

In some implementations, the device further includes a physical layer interface circuit that provides the shared data transfer clock signal to both the non-target double data rate memory rank and the target double data rate memory rank.

In some examples, the control logic maintains a read synchronization counter and a write synchronization counter for each of the target double data rate memory rank and the non-target double data rate memory rank and issues the data transfer clock synchronization command based on the maintained read synchronization counter and the write synchronization counter for each of the target double data rate memory rank and the non-target double data rate memory rank.

In some implementations, the memory controller places the non-target DDR memory rank in a reduced power mode, arbitrates among incoming memory access commands destined for the target DDR memory rank while the non-target DDR memory rank is in the reduced power mode and detects that the non-target DDR memory rank is required to come out of the reduced power mode. In some implementations the memory controller pauses (e.g., stops) arbitrating among incoming memory access commands destined for the target DDR memory rank, lets the target DDR memory rank become out of synchronization, removes the non-target DDR memory rank from the reduced power mode, and resumes the arbitrating among incoming memory access commands destined for the target DDR memory rank.

In some examples, the device includes the non-target double data rate memory rank and the target double data rate memory rank that are each coupled to the physical layer interface circuit and each connected to receive the shared data transfer signal from the physical layer interface circuit. In some implementations, the physical layer interface circuit provides a memory bus that provides the memory clock and the data transfer clock synchronization command.

In some implementations, the non-target double data rate memory rank and the target double data rate memory rank each include reduced power double data rate memory, such as LPDDR5 memory.

According to certain examples, a device includes a plurality of double data rate (DDR) memory ranks that include at least a non-target double data rate memory rank and a target double data rate memory rank, a physical layer interface circuit, in communication with the non-target double data rate memory rank and a target double data rate memory rank, and provides a shared data transfer clock signal to both the non-target double data rate memory rank and the target double data rate memory rank and to provide a shared memory clock. In some examples, the device includes a memory controller, in communication with the physical layer interface circuit, that processes incoming memory access commands, such as read and/or write commands, destined for at least one of a plurality of double data rate memory ranks. In some examples the memory controller determines when the target DDR memory rank is out of synchronization with respect to the shared data transfer clock and the memory clock, and in response to determining that the target DDR memory rank is out of synchronization with respect to the shared data transfer clock (e.g., write clock (WCK)) and the memory clock, determines whether the non-target DDR memory rank is out-of-synchronization with respect to the shared data transfer clock (e.g., write clock (WCK)) and the memory clock, and issues a data transfer clock synchronization command to the target DDR memory rank in response to determining that the non-target DDR memory rank is out-of-synchronization with respect to the shared data transfer clock and the memory clock.

In some examples, the memory controller, in response to determining that the target double data rate memory rank is out of synchronization, determines whether the non-target double data rate memory rank is in synchronization with the memory clock, and in response to determining that the non-target double data rate memory rank is in synchronization with the memory clock, determines a rank synchronization switch occasion for the non-target double data rate memory rank indicating a transition from an in-synchronization condition to an out-of-synchronization condition with the memory clock, and issues the data transfer clock synchronization command to the target double data rate memory rank in response to determining the rank synchronization switch occasion for the non-target double data rate memory rank.

In some implementations, the device includes a read synchronization counter and a write synchronization counter for each of the target double data rate memory rank and the non-target double data rate memory rank. In some examples, the memory controller issues the data transfer clock synchronization command based on count values maintained in the read synchronization counter and the write synchronization counter for each of the target double data rate memory rank and the non-target double data rate memory rank. In some implementations the device includes a control register configured to store data representing a synchronization timing count value for each read synchronization counter and write synchronization counter.

In some examples, the memory controller places the non-target DDR memory rank in a reduced power mode and arbitrates among incoming memory access commands destined for the target DDR memory rank while the non-target DDR memory rank is in the reduced power mode. In certain implementations, the memory controller detects that the non-target DDR memory rank is required to come out of the reduced power mode and pauses the arbitrating among incoming memory access commands destined for the target DDR memory rank. In some examples, the memory controller lets the target DDR memory rank become out of synchronization, removes the non-target DDR memory rank from the reduced power mode, and resumes the arbitrating among incoming memory access commands destined for the target DDR memory rank.

In some implementations, the physical layer interface circuit provides a memory bus that provides the memory clock, the data transfer clock synchronization command and the shared data transfer clock signal to the DDR ranks. In some examples, the non-target double data rate memory rank and the target double data rate memory rank each include a reduced power double data rate memory, such as a JEDEC compliant LPDDR5 memory.

FIG. 1 illustrates a non-limiting example block diagram illustrating a data processing system 100 according to some embodiments. Data processing system 100 includes generally a data processor 110 in the form of an accelerated processing unit (APU), a memory system 120, a peripheral component interconnect express (PCIe) system 150, a universal serial bus (USB) system 160, and a disk drive 170. Data processor 110 operates as the central processing unit (CPU) of data processing system 100 and provides various buses and interfaces useful in modern computer systems. These interfaces include two double data rate (DDRx) memory channels, a PCIe root complex for connection to a PCIe link, a USB controller for connection to a USB network, and an interface to a Serial Advanced Technology Attachment (SATA) mass storage device. Data processing system can be any suitable device such as but not limited to a cloud server, a mobile device, desktop computer, game console, printer, camera, wearable or any suitable device.

In this example, memory system 120 includes a memory channel 130 and a memory channel 140. Memory channel 130 includes a set of dual inline memory modules (DIMMs) connected to an LPDDRx bus, in this example a shared bus structure 132, including representative double data rate memory ranks 134, 136, and 138 that in this example correspond to separate ranks. Likewise memory channel 140 includes a set of DIMMs connected to an LPDDRx bus, also a shared bus but may be a non-shared bus 142, including representative DIMMs 144, 146, and 148. An LPDDR5 dual in-line memory module (DIMM), for example, has two independent 32-bit channels referred to as "sub-channels". Each LPDDRx bus are part of a shared bus structure as shown in more detail in FIG. 4. From a DRAM memory controller architecture usage perspective, a single memory controller runs a 32-bit channel independently however, any suitable number of channels can be supported, where each channel shares a data transfer clock among ranks.

PCIe system 150 includes a PCIe switch 152 connected to the PCIe root complex in data processor 110, a PCIe device 154, a PCIe device 156, and a PCIe device 158. PCIe device 156 in turn is connected to a system basic input/output system (BIOS) memory 157. System BIOS memory 157 can be any of a variety of non-volatile memory types, such as read-only memory (ROM), flash electrically erasable programmable ROM (EEPROM), and the like.

USB system 160 includes a USB hub 162 connected to a USB master in data processor 110, and representative USB devices 164, 166, and 168 each connected to USB hub 162. USB devices 164, 166, and 168 could be devices such as a keyboard, a mouse, a flash EEPROM port, and the like. Disk drive 170 is connected to data processor 110 over a SATA bus and provides mass storage for the operating system, application programs, application files, and the like.

Data processing system 100 is suitable for use in modern computing applications by providing a memory channel 130 and a memory channel 140. Each of memory channels 130 and 140 can connect to state-of-the-art DDR memories such as LPDDR5, high bandwidth memory (HBM), other suitable memories, and can be adapted for future memory technologies. These memories provide high bus bandwidth and high speed operation. At the same time, they also provide reduced power modes to save power for battery-powered applications such as laptop computers, and also provide built-in thermal monitoring.

Figure 2:
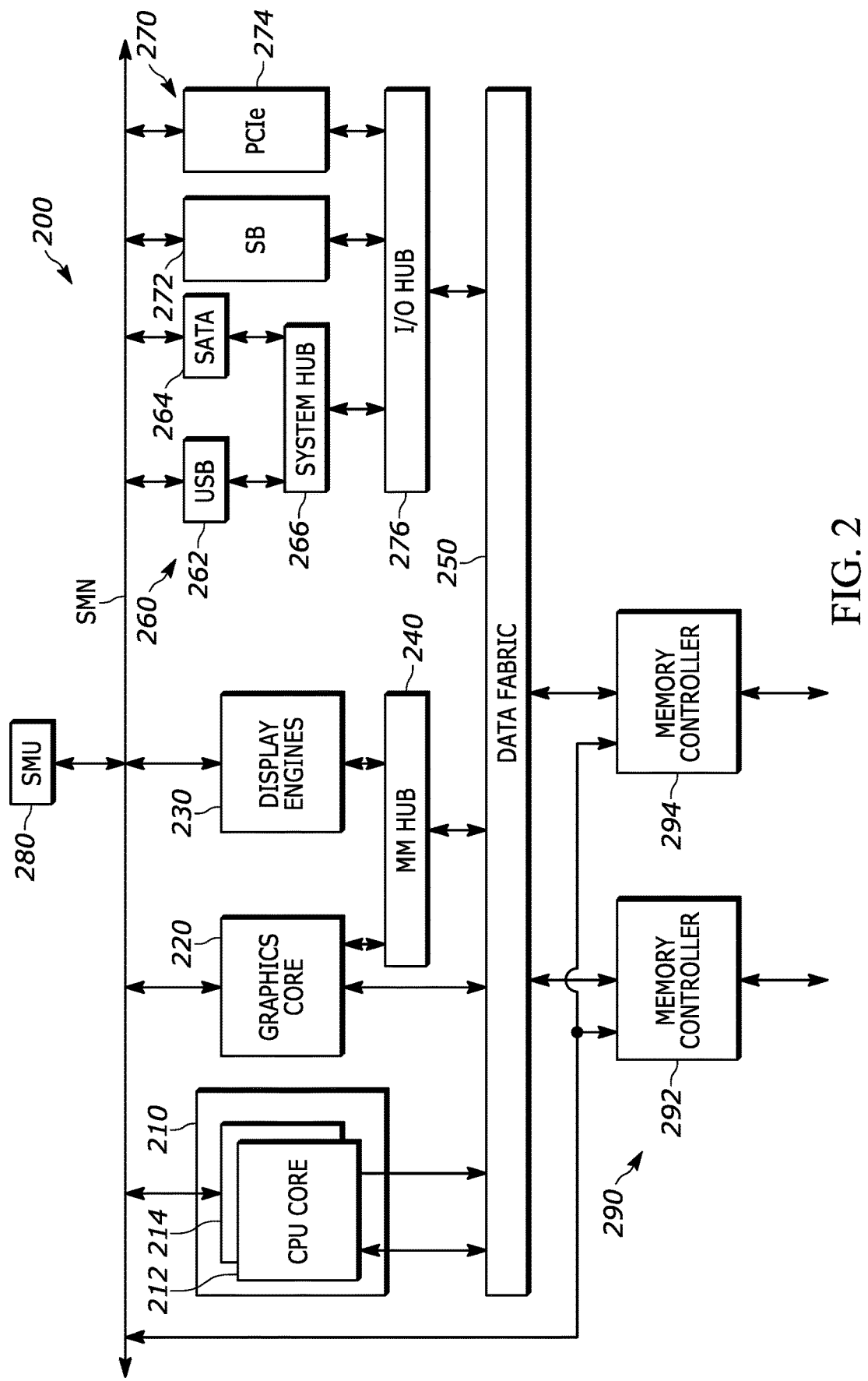
FIG. 2 illustrates in block diagram of an accelerated processing unit (APU) suitable for use in the data processing system of FIG. 1.

FIG. 2 illustrates in block diagram form an APU 200 suitable for use in data processing system 100 of FIG. 1. APU 200 includes generally a central processing unit (CPU) core complex 210, a graphics core 220, a set of display engines 230, a memory management hub 240, a data fabric 250, a set of peripheral controllers 260, a set of peripheral bus controllers 270, a system management unit (SMU) 280, and a set of memory controllers 290 that in this example, include memory controller 292 and memory controller 294.

CPU core complex 210 includes a CPU core 212 and a CPU core 214. In this example, CPU core complex 210 includes two CPU cores, but in other embodiments CPU core complex can include an arbitrary number of CPU cores. Each of CPU cores 212 and 214 is bidirectionally connected to a system management network (SMN), which forms a control fabric, and to data fabric 250, and is capable of providing memory access requests to data fabric 250. Each of CPU cores 212 and 214 may be unitary cores, or may further be a core complex with two or more unitary cores sharing certain resources such as caches.

Graphics core 220 is a high performance graphics processing unit (GPU) capable of performing graphics operations such as vertex processing, fragment processing, shading, texture blending, and the like in a highly integrated and parallel fashion. Graphics core 220 is bidirectionally connected to the SMN and to data fabric 250, and is capable of providing memory access requests to data fabric 250. In this regard, APU 200 may either support a unified memory architecture in which CPU core complex 210 and graphics core 220 share the same memory space, or a memory architecture in which CPU core complex 210 and graphics core 220 share a portion of the memory space, while graphics core 220 also uses a private graphics memory not accessible by CPU core complex 210.

Display engines 230 render and rasterize objects generated by graphics core 220 for display on a monitor. Graphics core 220 and display engines 230 are bidirectionally connected to a common memory management hub 240 for uniform translation into appropriate addresses in memory system 120, and memory management hub 240 is bidirectionally connected to data fabric 250 for generating such memory accesses and receiving read data returned from the memory system.

Data fabric 250 includes a crossbar switch for routing memory access requests and memory responses between any memory accessing agent and memory controllers 290. It also includes a system memory map, defined by BIOS, for determining destinations of memory accesses based on the system configuration, as well as buffers for each virtual connection.

Peripheral controllers 260 include a USB controller 262 and a SATA interface controller 264, each of which is bidirectionally connected to a system hub 266 and to the SMN bus. These two controllers are merely exemplary of peripheral controllers that may be used in APU 200.

Peripheral bus controllers 270 include a system controller or "Southbridge" (SB) 272 and a PCIe controller 274, each of which is bidirectionally connected to an input/output (I/O) hub 276 and to the SMN bus. I/O hub 276 is also bidirectionally connected to system hub 266 and to data fabric 250. Thus for example a CPU core can program registers in USB controller 262, SATA interface controller 264, SB 272, or PCIe controller 274 through accesses that data fabric 250 routes through I/O hub 276.

SMU 280 is a local controller that controls the operation of the resources on APU 200 and synchronizes communication among them. SMU 280 manages power-up sequencing of the various processors on APU 200 and controls multiple off-chip devices via reset, enable and other signals. SMU 280 includes one or more clock sources not shown in FIG. 2, such as a phase locked loop (PLL), to provide clock signals for each of the components of APU 200. SMU 280 also manages power for the various processors and other functional blocks, and may receive measured power consumption values from CPU cores 212 and 214 and graphics core 220 to determine appropriate power states.

APU 200 also implements various system monitoring and power saving functions. In particular one system monitoring function is thermal monitoring. For example, if APU 200 becomes hot, then SMU 280 can reduce the frequency and voltage of CPU cores 212 and 214 and/or graphics core 220. If APU 200 becomes too hot, then it can be shut down entirely. Thermal events can also be received from external sensors by SMU 280 via the SMN bus, and SMU 280 can reduce the clock frequency and/or power supply voltage in response.

Figure 3:
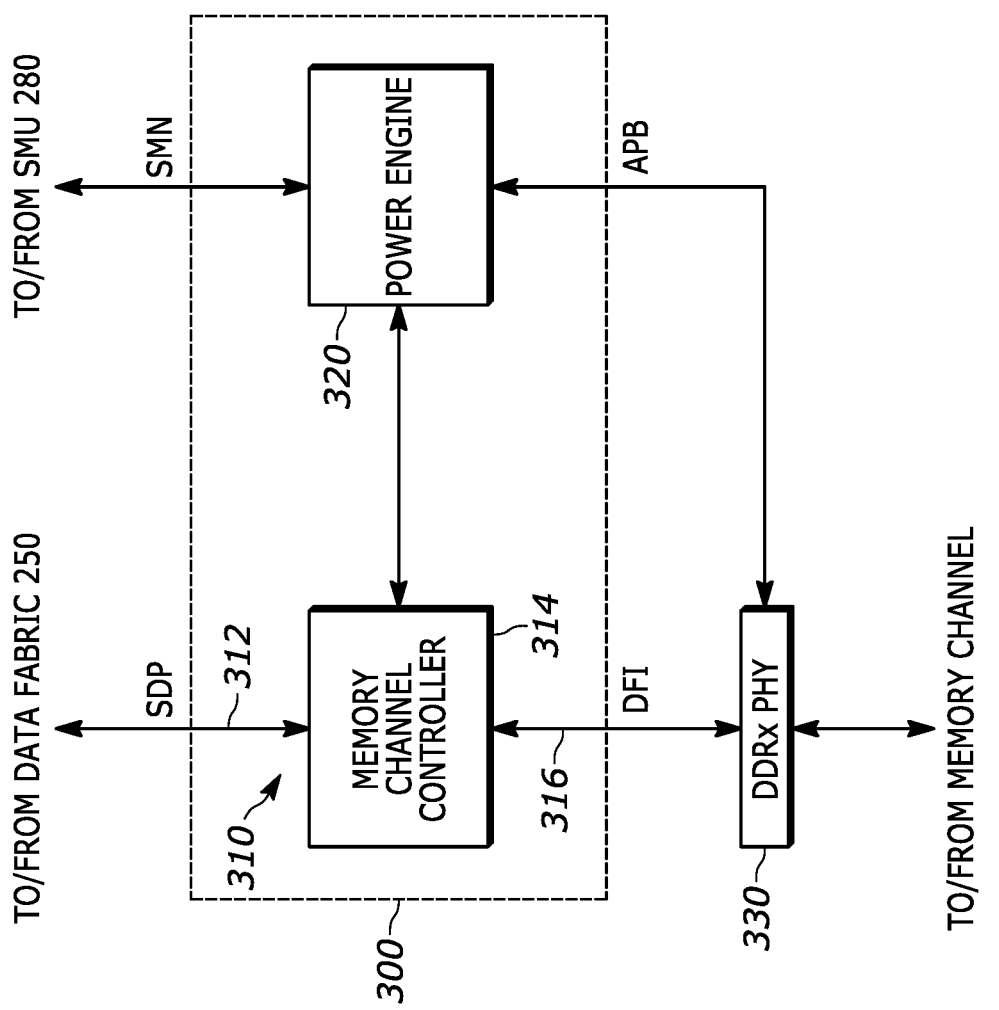
FIG. 3 illustrates in block diagram of a memory controller and associated physical interface (PHY) suitable for use in the APU of FIG. 2 according to some embodiments.

FIG. 3 illustrates in block diagram form a memory controller 300 and an associated physical interface (PHY) 330 suitable for use in APU 200 of FIG. 2 according to some embodiments. Memory controller 300 includes a memory channel 310 and a power engine 320. Memory channel 310 includes a host interface 312, a memory channel controller 314, and a physical interface 316. Host interface 312 bidirectionally connects memory channel controller 314 to data fabric 250 over a scalable data port (SDP). Physical interface 316 bidirectionally connects memory channel controller 314 to PHY 330 over a bus that conforms to the DDR-PHY Interface Specification (DFI). Power engine 320 is bidirectionally connected to SMU 280 over the SMN bus, to PHY 330 over the Advanced Peripheral Bus (APB), and is also bidirectionally connected to memory channel controller 314. PHY 330 has a bidirectional connection to a memory channel such as memory channel 130 or memory channel 140 of FIG. 1. Memory controller 300 is an instantiation of a memory controller for a single memory channel using a single memory channel controller 314, and has a power engine 320 to control operation of memory channel controller 314 in a manner that will be described further below.

Figure 4:
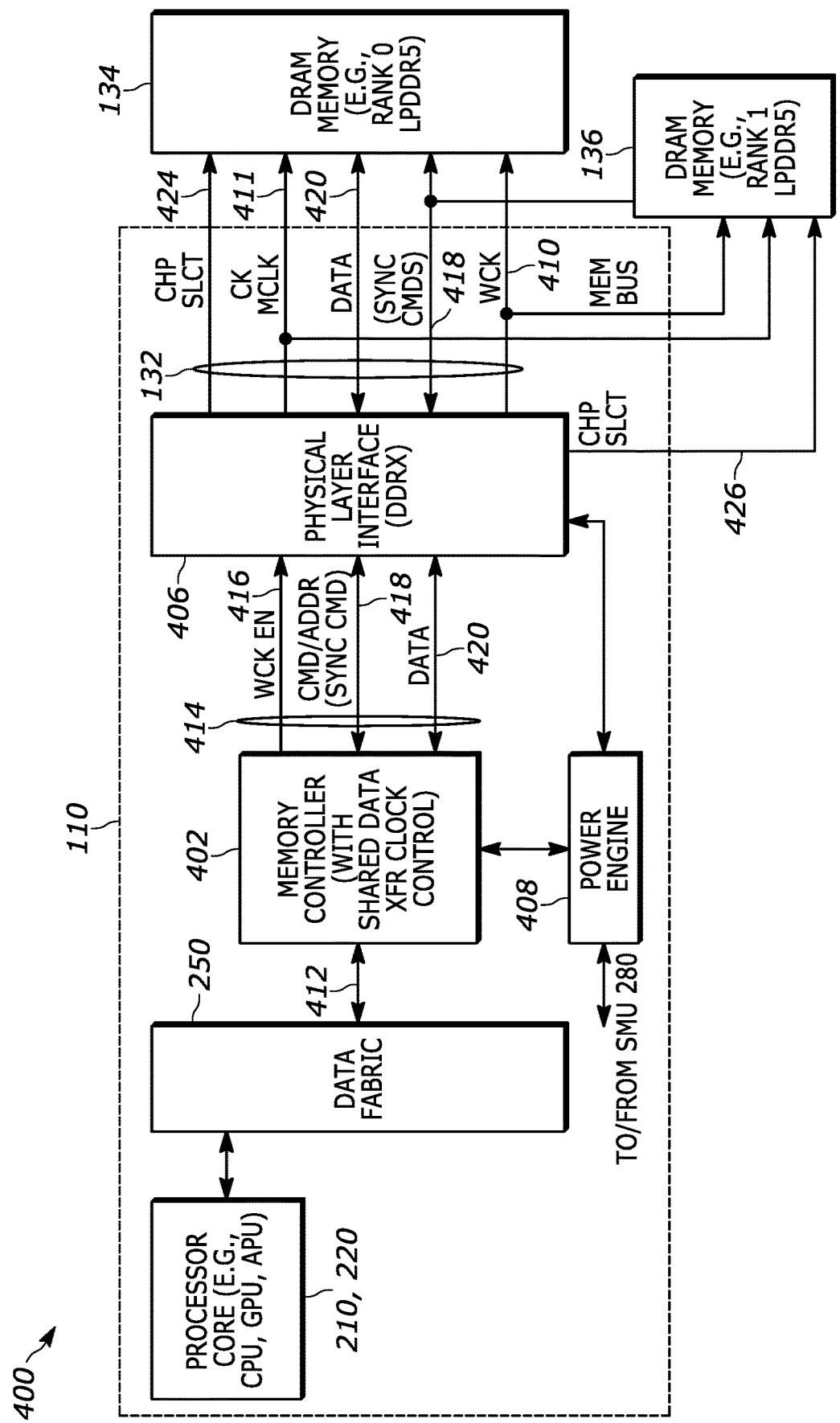
FIG. 4 is a block diagram illustrating one example of a data processing system employing a shared data transfer clock in accordance with one aspect of the description.

FIG. 4 illustrates a block diagram of one example of a device 400 that employs a memory controller 402 with shared data transfer clock control as further described herein. In this example, the LPDDRx bus 132 is a shared bus structure between a physical layer interface circuit 406 and a plurality of the double data rate memory ranks 134 and 136. A power engine 408 controls the power levels of the double data rate memory ranks 134 and 136, as well as the DDR physical layer interface circuit 406 and memory controller 402, if desired to conserve power consumption.

In this example, the physical layer interface circuit 406 provides a shared data transfer clock 410 to the DDR memory ranks 134 and 136. In this example, a target DDR memory rank is the memory rank to which the memory controller wishes to transfer data through any suitable operation such as read and/or write commands. A non-target DDR memory rank is a memory rank that is not being accessed by the memory controller 402 through, for example, read and/or write commands. In this example, the DDR memory ranks 134 and 136 are LPDDR5 memories that are compliant with the JEDEC specification and employ a data transfer clock and memory clock in compliance with the LPDDR5 JEDEC specification. However, any suitable DDR memory ranks that employ a data transfer clock and memory clock may be employed.

In operation, the memory controller 402 processes memory access commands such as read and/or write commands issued by the CPU core complex 210 and/or graphics core 220 through data fabric 250 via communication path 412. The memory controller 402 provides a type of serial access between the double data rate memory ranks 134 and 136 such that writing of data to both ranks does not occur simultaneously. For example, one DDR memory rank is controlled for respective read and write operations while the other memory rank does not transfer data for its particular memory rank and in some implementations is placed in a lower power state through power engine 408 when idle.

Memory controller 402 communicates with the physical layer interface circuit 406 through communication path 414 such as one or more buses and provides write clock enable data 416 to enable the shared data transfer clock 410 through the physical layer interface circuit 406. Memory controller also provides synchronization commands 418 as further described below. Memory controller also provides and other information such as memory address information and other control information to the DDR physical layer interface circuit 406 in compliance with LPDDR5 operation along with data 420 that is written to or read from a respective double data rate memory rank 134 and 136.

The DDR physical layer interface circuit 406 in one example is an integrated circuit that includes one or more state machines or other suitable logic such as a digital signal processor (DSP), or any other suitable logic operative to perform the operations described herein. The memory controller 402 in one example is a portion of an integrated circuit such as a system of chip (SoC), integrated as part of an APU chip, GPU chip, CPU chip or any other suitable circuit that accesses double data rate memory. As further described below, the memory controller 402 in some implementations, includes logic, such as one or more state machines, registers and/or discrete logic configured to operate as described herein. In other implementations the memory controller 402 is implemented as any other suitable logic such as in the form of one or more processors that execute instructions that are stored in memory. A chip select signal 424 and 426 allows the physical layer interface circuit 406 to target each of the respective double data rate memory ranks 134 and 136 as instructed by the memory controller.

The shared bus structure 132 provides the shared (the same) data transfer clock 410 from the physical layer interface circuit 406 to the plurality of double data rate memory ranks 134 and 136 and also provides synchronization commands 418 and other information issued by the memory controller 402. The shared bus structure 132 serves as a shared memory bus that in this example, provides the memory clock 411, the data transfer clock synchronization command 418, and data 420 between the DDR physical layer interface circuit 406 and the plurality of DDR memory ranks 134 and 136. As such, each of the plurality of memory ranks are connected to receive the shared data transfer signal from the physical layer interface circuit 406 through the shared bus structure 132. The timing of the memory clock 411 and shared data transfer clock 410 are, in this example, configured to operate in compliance with the LPDDR5 JEDEC specification. However other timing protocol may also be used.

The memory controller 402 processes incoming memory access commands, such as read and/or write commands issued by a processor core, such as CPU core complex 210, graphics core 220, or other memory access engines in the system via the data fabric 250 that are destined for one of the double data rate memory ranks 134 and 136. The memory controller 402, in one example, uses the memory address of the memory access command to determine which rank is a target double data rate memory rank versus a non-target DDR memory rank. For example, if the incoming memory address falls within the memory address associated with a particular DDR memory rank, that memory rank is considered the target memory rank for the given memory access command. The memory controller 402 in one example determines when a target DDR memory rank is out of synchronization with respect to the shared data transfer clock 410 and the memory clock 411. As further described below, in one example, the memory controller 402 maintains track of synchronization windows through timing window information to determine when a memory rank that employs the shared data transfer clock 410 is in or out of synchronization.

In one example, the memory controller 402, upon determining that the target DDR memory rank is out of synchronization, determines whether the non-target DDR memory rank is also out of synchronization. If the non-target DDR memory rank is also out of synchronization, the memory controller 402 issues a data transfer clock synchronization command 418 to the target DDR memory rank to synchronize the target DDR memory rank so that data transfer can occur.

In one example, the memory controller 402 in response to determining that the target double data rate memory rank is out of synchronization, also determines whether the non-target double data rate memory rank is in synchronization with the memory clock and if so, determines a rank synchronization switch occasion for the non-target double data rate memory rank. The rank synchronization switch occasion indicates a transition from an in synchronization condition of a memory rank to an out of synchronization condition. The memory controller 402 issues a data transfer clock synchronization command 418 to the target double data rate memory rank in response to determining the rank synchronization switch occasion for the non-target double data rate memory rank and as such waits for the non-target DDR rank to transition from in-sync to out-of-sync.

Figure 5:
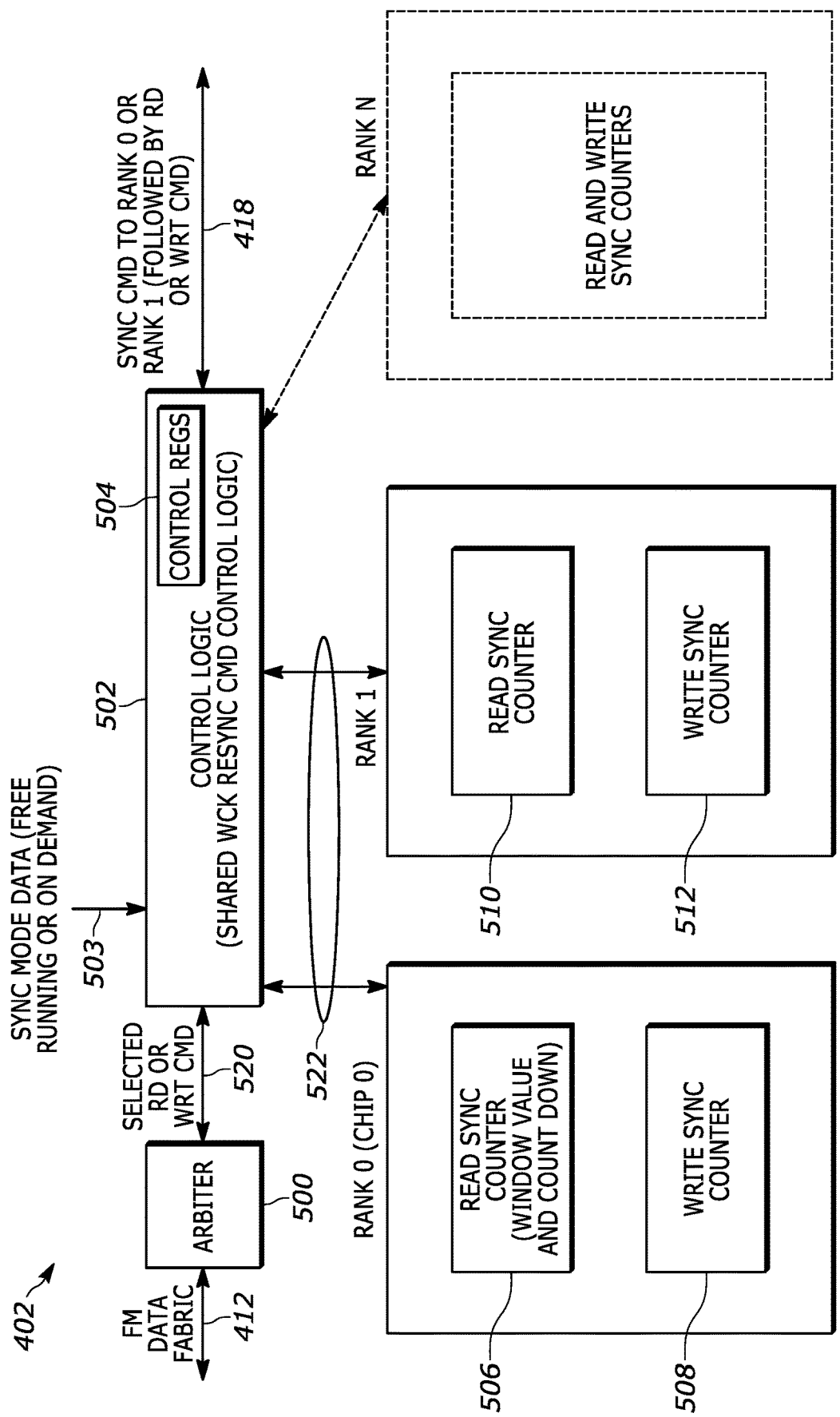
FIG. 5 is a block diagram illustrating one example of a memory controller in accordance with one example disclosed herein.

FIG. 5 is a block diagram illustrating one example of a relevant portion of the memory controller 402. In this example, the memory controller 402 includes an arbiter 500 that is in communication with a command queue (not shown) that receives memory access commands from the data fabric and performs arbitration operations among the incoming memory access commands. The memory controller 402 includes control logic 502 that in one example, employs a control register 504. The control logic 502 serves as a type of shared data transfer clock control logic that provides synchronization commands to the DDR memory ranks that share the same data transfer clock 410. The memory controller 402 in this example includes, for each rank, read synchronization counters and corresponding write synchronization counters. For example, for double data memory rank 134 (e.g., rank 0) there are read synchronization counters 506 and corresponding write synchronization counters 508. Likewise, for double data memory rank 136 (e.g., rank 1) there are read synchronization counters 510 and write synchronization counters 512. The starting count value corresponds to a synchronization window period and the current count value indicates how long the previous synchronization command will last. A synchronization command is typically issued for each read and each write when the target rank (WCK) is out of synchronization. When a synchronization command is issued (in the on-demand mode) a synchronization window becomes active. Within a synchronization window a subsequent read or write command does not need an additional synchronization command. Once read or writes commands are issued within a synchronization window a new synchronization window is added (e.g., counters updated) and the data transfer clock stays synchronized. In some implementations, there are two synchronization modes, a free running mode and an on-demand mode. For the free running mode, once the ranks are synchronized the ranks stay synchronized and no new synchronization commands are needed (except for power down situations). For the on-demand mode there are windows defining a number of memory clocks that the data transfer clock will be synchronized. The counters are updated with the window counts when new read/write commands are issued or when a synchronization command is issued (in some implementations, synchronization commands are only issued when a rank is out of synchronization). The synchronization window periods in some examples are different for read operations versus write operations.

In operation, the arbiter 500 provides a selected read or write command 520 or group of commands to the control logic 502. The control logic 502 uses the associated memory address to determine which memory rank a particular command is accessing and then interprets that memory rank as the target memory rank for that memory access command. The control register(s) 504 in one example is set through any suitable user interface or through an operating system to set the read synchronization window and write synchronization window to define timing parameters such as timing windows for read and/or write synchronizations so that out of synchronization conditions can be detected as well as in synchronization conditions. In one example, an out of synchronization condition (e.g., the data transfer clock and memory clock are not in synchronization) for a rank is detected when both a read counter and write counter for a rank both reach zero. However, any suitable criteria may be employed. The control logic 502 issues a synchronization command 418 for a respective DDR memory rank as further described below.

The control logic 502 sets and reads the synchronization counter values as needed through a suitable communication path 522. As such, the control logic 502 maintains a read synchronization counter 506, 510 and write synchronization counter 508 and 512 for each of the target double data rate memory rank and the non-target double data rate memory rank and issues the data transfer clock synchronization command based on the maintained read synchronization counter and the write synchronization counter for each of the double data rate memory ranks. In one example, the control logic determines that a rank is out of synchronization when both the read and write counters for that rank are zero.

In other implementations, the read synchronization counter and the write synchronization counters per rank are implemented as one unified counter. In this implementation, the control logic 502 detects that a rank is out of synchronization when the unified counter is zero. The unified counter is updated with a new read window or write window based on whether the synchronization command is for a read or a write, or based on whether a new read or write command gets issued while the rank is synchronized. In some implementations the read window or write window is different. As such, the control logic 502 maintains the unified synchronization counter for each of the target double data rate memory rank and the non-target double data rate memory rank and issues the data transfer clock synchronization command based on the maintained unified synchronization counter for each memory rank.

The control logic 502 also receives mode information 503 indicating whether the memory controller should operate in a free running mode or an on-demand mode. In some implementations, the mode information is set in a control register, and is provided by an operating system, or other source and indicates how to operate the DDR memory ranks. In free run mode, the plurality of DDR memory ranks are synchronized together once and operate command issuance in a conventional manner. For an on-demand mode, in some implementations the read and/or write command operation is extended past one typical synchronization cycle. For example, before a synchronization period expires, if another read or write command operation is performed during a same synchronization window, the issued commands extend the synchronization window. For example, the respective counter is reset with a new window amount.

In some implementations, in an on-demand mode, if a memory rank is idle, the memory clock and data transfer clock are left to become out of synchronization. When the rank needs to be accessed, a synchronization command is sent to the DDR memory rank to resynchronize the memory rank to provide read and write operations to that particular rank. In a free running mode, the data transfer clock is always on. In an on-demand mode, synchronization commands are provided to carry out a read operation using the data transfer clock as well as for write operations and when complete, the shared data transfer clock 410 is left off by the physical layer interface circuit 406 in compliance with the LPDDR5 JEDEC operation. In an on-demand operation, for example, for a read command to be executed with a target rank, once a read synchronization command is sent, there are a certain number of clocks to perform the read operation. In one example, the read synchronization counter is set to the allowable number of clocks as a read window value and the clock is allowed to count down. When the read synchronization counter reaches 0, for example, the control logic 502 detects an out of synchronization condition and can reissue another synchronization command to extend the read operation or perform other operations as desired. Each synchronization command issuance resets a respective read synchronization counter or write synchronization counter to the window level. A similar operation is performed with each write synchronization counter such that the control logic sets the counter value, for example, to a value set in the control register 504 and counts down to 0. When the counter reaches 0 for both read and write counters for the target rank, the control logic 502 determines that the target DDR memory rank is out of synchronization. It will be recognized that any other suitable mechanism may be employed including counters that count up instead of count down or any other suitable mechanism may be employed.

In some implementations, the DDR memory ranks are powered down or have other reduced power states whether they are in a free running mode or in an on-demand mode. For example, if one DDR memory rank does not have incoming write commands for a period of time, power is reduced or shut off for that particular rank. When memory access commands are detected by the memory controller or other logic, for the rank in low power mode the rank is powered back up using the power engine.

In one example, the read synchronization counter stores a count value as to when a read synchronization command is to expire, for example, and the write synchronization counter stores a count value as to when a write synchronization command is to expire. The counters are reset to the write command or read command window duration when respective commands are issued. In operation, the memory controller 402 attempts to make sure that no overlapping read and/or write commands occur or overlap between the DDR ranks with a common data transfer clock. For example, when one rank is using the data transfer clock and a memory access is being processed and attempts to access the other rank, toggling of the data transfer clock can cause data errors. In operation, the memory controller 402 effectively waits for a current rank or the target rank synchronization to expire before performing read or write operations through the other rank. As such the memory controller only accesses one rank at a time for data transfer.

Figure 6:
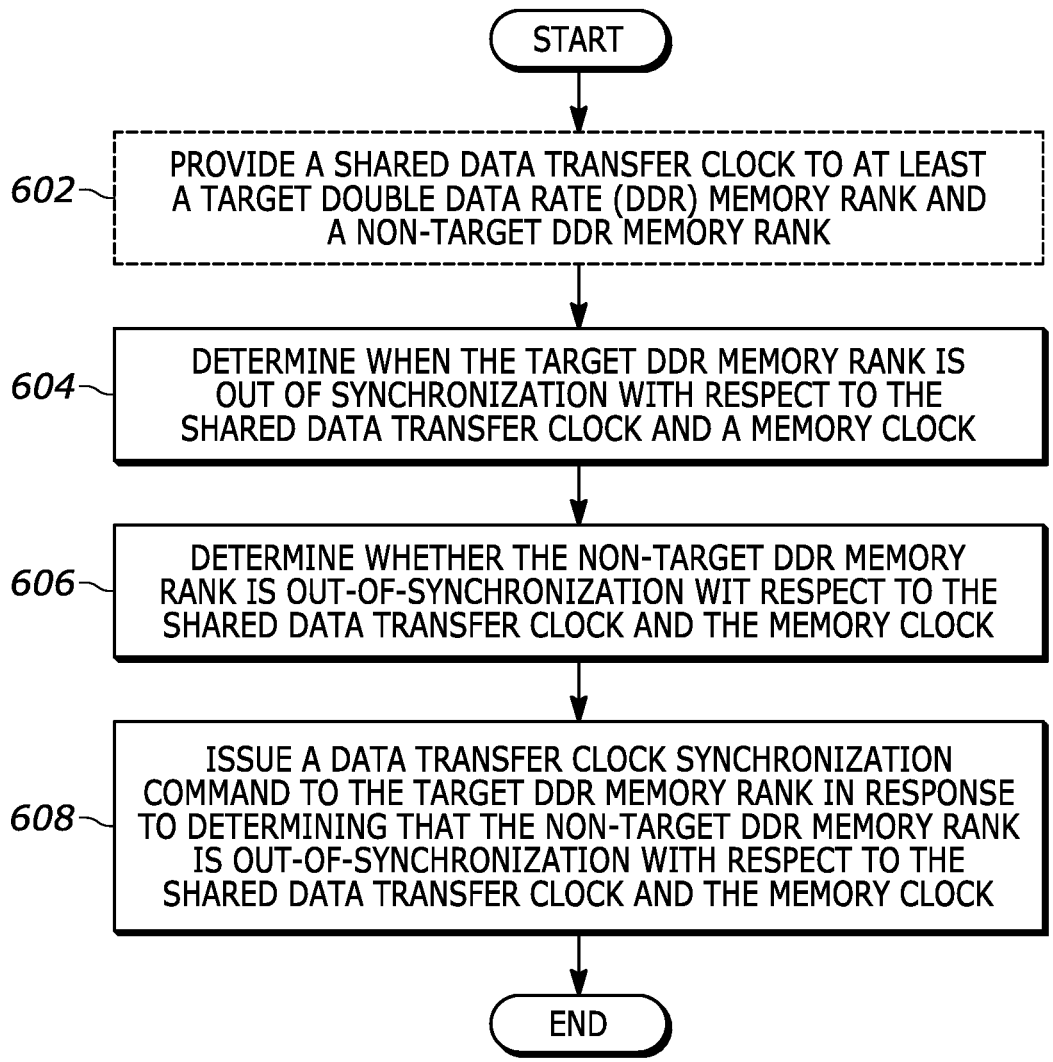
FIG. 6 is a flowchart illustrating one example of a method for synchronizing a plurality of double data rate memory ranks in accordance with one example set forth in the disclosure.

FIG. 6 is a flowchart illustrating one example of a method for synchronizing a plurality of double data rate memory ranks. In one example, the method includes providing the shared data transfer clock 410 to at least a target double data rate memory rank such as memory rank 134 and a non-target DDR memory rank, such as memory rank 136 as shown in block 602. In one example, this is done through the physical layer interface circuit 406 that provides the same data transfer clock 410 signal to both the DDR memory ranks 134 and 136 from a same pin for example. However, any suitable connection may be employed so that the same shared data transfer clock signal 410 is provided to multiple DDR memory ranks.

As shown in block 604, the method includes determining when the target DDR memory rank is out of synchronization with respect to the shared data transfer clock and the memory clock. In one example, this is done on a per-read command basis and per-write command basis for the target DDR memory using the respective read synchronization counter and write synchronization counter for whichever DDR memory rank is the target DDR memory rank. As shown in block 606, the method includes determining whether the non-target DDR memory rank is out of synchronization with respect to the shared data transfer clock and the memory clock. For example, at control logic 502 also monitors the read synchronization counter or write synchronization counter of the non-target DDR memory rank to determine out of synchronization condition. For example, when a read operation is being performed on a target DDR memory rank, the read synchronization counter for the target memory rank is evaluated to determine if the target DDR memory rank is out of synchronization. As shown in block 608, the method includes issuing a data transfer clock synchronization command to the target DDR memory rank in response to the control logic determining that the non-target DDR memory rank is out of synchronization. As a result, the target DDR memory rank will be synchronized through issuance of a synchronization command when both the target DDR memory rank and the non-target DDR memory rank are determined to be out of synchronization.

In certain implementations, the method includes the control logic 502 determines whether the non-target double data rate memory rank is in synchronization with the memory clock, in response to determining that the target double data rate memory rank is out of synchronization. When the non-target double data rate is determined to be in synchronization with the memory clock but the target double data rate memory rank is out of synchronization, the control logic 502 determines a rank synchronization switch occasion for the non-target double data rate memory rank indicating a transition from an in synchronization condition to an out-of-synchronization condition of the non-target DDR memory rank and issues the data transfer clock synchronization command to the target double data rate memory rank. Determining when DDR memory ranks are out of synchronization is done by maintaining respective read synchronization counters and write synchronization counters for each of the respective double data rate memory ranks. The method includes issuing the data transfer clock synchronization command based on the maintained read synchronization counter and write synchronization counter for each of the target double data memory ranks and the non-target double data rate memory ranks.

Figure 7:
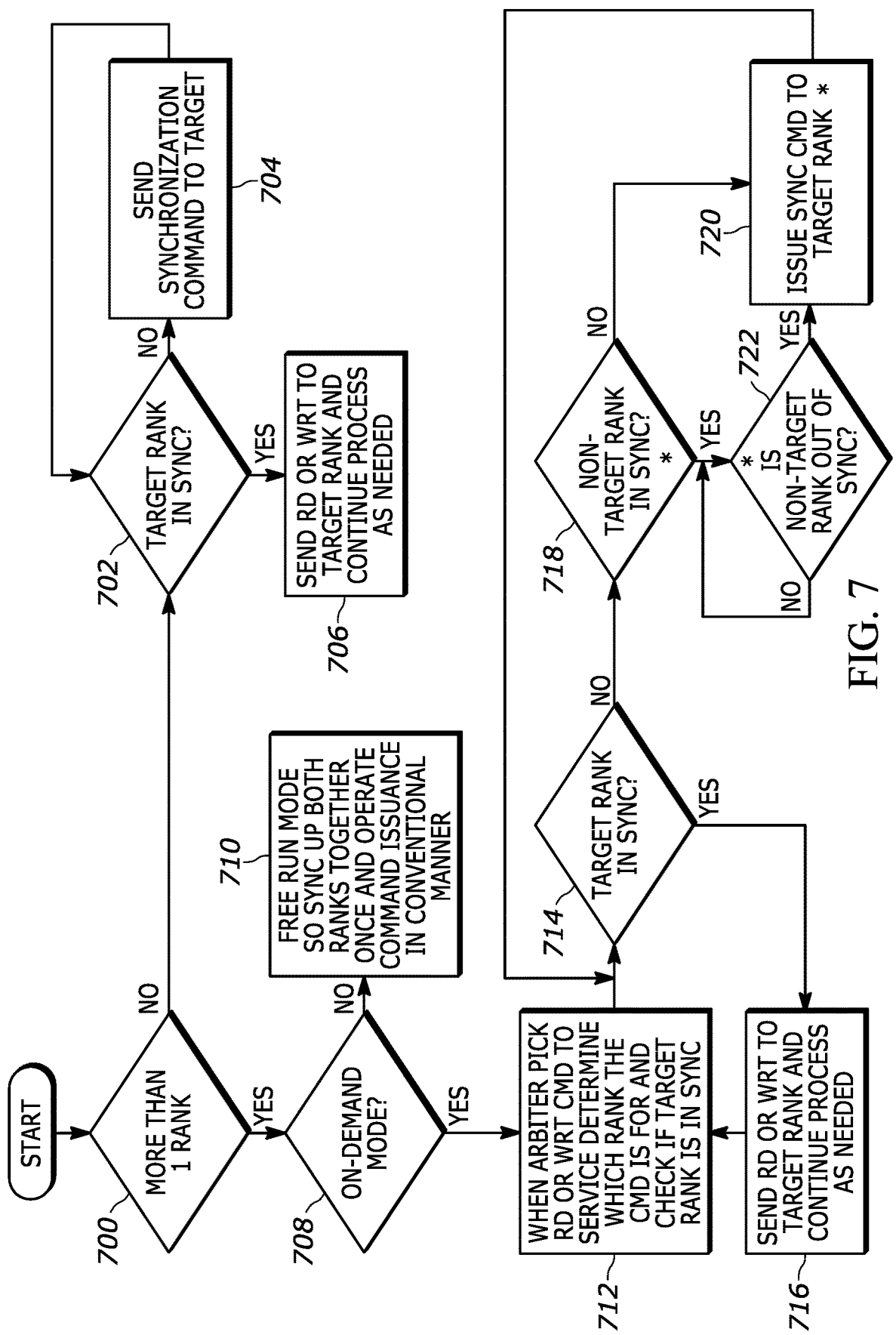
FIG. 7 is a flowchart illustrating one example of a method for synchronizing a plurality of double data rate memory ranks in accordance with one example set forth in the disclosure.

FIG. 7 is a flowchart illustrating one example of a method for synchronizing a plurality of double data rate memory ranks according to one implementation. The method in one example is carried out by the memory controller 402 and in some implementations, by the control logic 502, however any suitable components may be employed. As shown in block 700, the method includes determining if there is more than one rank connected to the physical layer interface circuit 406. In one example, the control logic 502 through one or more control registers set through the operating system, driver or other mechanism indicates how many ranks are connected to the physical layer interface circuit 406. This also may be done through a BIOS setting or other suitable setting. If there is only one rank, as shown in block 702, the method includes determining when the target rank is synchronized, such as through the read synchronization counters and write synchronization counters or other suitable detection mechanism. If the one rank is not in synchronization to allow a read or write access, the control logic sends a synchronization command to the target rank as shown in block 704. This operation will place the target rank in synchronization and as shown in block 706, the method includes sending, such as by the control logic, the read or write command to the target rank. The process is then continued with the single rank to suitably maintain synchronization when read and write accesses are required.

If there is more than one rank, as shown in block 708, the method includes determining the mode of operation such as by the mode information 503 which indicates whether the operational mode is an on-demand mode or a free run mode. If the free run mode is set, the plurality of DDR memory ranks are synchronized together by sending suitable synchronization commands to both DRAM ranks and are operated together as though the memory controller sees one memory grouping. This is shown in block 710.

If however, the mode information 503 indicates that the mode is an on-demand mode, as shown in block 712, the method includes receiving a read or write command from the arbiter to be serviced and determine which rank the received memory access command is for. This may be done, for example, by the control logic 502 evaluating the memory address associated with the received command and determining which rank address space is being accessed by the command. The rank whose memory address corresponds to the incoming command is determined to be the target rank and the method includes determining if that particular rank is in synchronization (the data transfer clock (WCK) is synchronized with the memory clock). The synchronization status is determined as shown in block 714, for example, by checking the corresponding read synchronization counter and/or write synchronization counter for the target rank. In one example, if either the read or write counter is a non-zero value, the memory rank is in synchronization. However, any suitable synchronization detection mechanism may be employed. As shown in block 716, if the target rank is in synchronization, the method includes sending the received read or write command to the target rank and continue receiving additional commands as shown in block 712. If however the target rank is not synchronized, meaning that the shared data transfer clock is not synchronized with the memory clock for that target rank, as shown in block 718, the method determines if the non-target rank is synchronized. This is done by seeing if either the read or write counter of the non-target rank is non-zero. If not, as shown in block 720, the method includes issuing a synchronization command to the new target rank (prior non-target rank) to switch between the ranks. If the non-target rank is synchronized, as shown in block 722, the method includes waiting until the non-target rank is out of synchronization (e.g., both read and write counters are zero or if a unified counter is used that the unified counter is zero) which is a rank synchronization switch occasion. In one example, the control logic waits for a safe data transfer clock rank reversal which includes waiting for a non-target rank synchronization condition to lapse. The rank synchronization switch occasion need not be a full lapse and the synchronization issuance process can begin by the control logic to issue the synchronization command to the target rank when the non-target rank is out of synchronization as shown in block 720.

Figure 8:
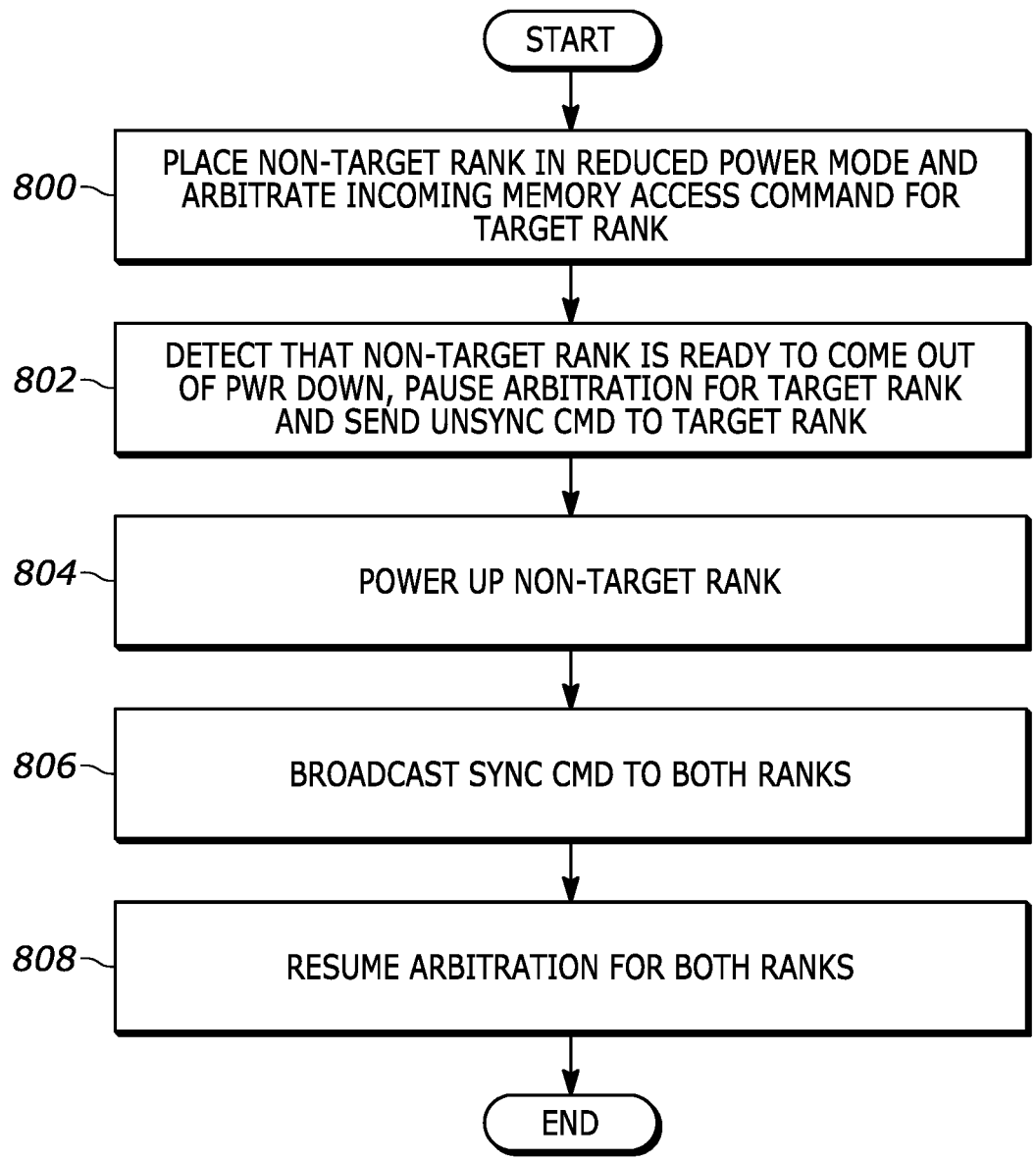
FIG. 8 is a flowchart illustrating one example of a method for powering up one or more of a plurality of double data rate memory ranks that share a data transfer clock in accordance with one example set forth in the disclosure.

FIG. 8 is a flowchart illustrating one example of the process for powering up a DDR memory rank during a free running mode. In this example, it will be assumed that target memory rank, in this example, double data rate memory rank 134 is on and non-target memory rank, in this example, double data rate memory rank 136 is off. As shown in block 800, the method includes placing the non-target DDR memory rank in a reduced power mode. In one example, this is done by the power engine 408 in response to the memory controller 402 determining that no memory accesses are being requested of the non-target memory rank, such as double data rate memory rank 136 in this example. The method includes arbitrating among incoming memory access commands, such as by the arbiter, that are destined for the target DDR memory rank while the non-target DDR memory rank (double data rate memory rank 136 in this example) is in the reduced power mode. In one example, the method includes detecting that the non-target DDR memory rank is required to come out of a reduced power mode as shown in block 802. This is done, for example, by the control logic 502 detecting that the arbiter 500 has provided memory access command whose memory address is in the memory address space of the non-target DDR memory rank. However, other suitable detection mechanisms may also be employed. The method includes pausing the arbitrating among the incoming memory access commands that are destined for the target DDR memory rank. The method includes allowing the target DDR memory rank to become out of synchronization. This includes, for example, sending an unsynchronization command to the current target rank or waiting for the synchronization time to lapse as indicated by read and write synchronization counters 506 and 508. However, any other mechanism may also be employed. As shown in block 804, the method includes removing the non-target DDR memory rank from the reduced power mode and in one example, includes powering up the non-target DDR memory rank. As shown in block 806, the method includes broadcasting a synchronization command to both the current target DDR memory rank and the non-target DDR memory rank to get both in synchronization. As shown in block 808, the method includes resuming the arbitrating among the incoming memory access commands destined for the target DDR memory rank. As such, arbitration is paused and restarted as well as a broadcasting synchronization commands to both DDR memory ranks.

Figure 9:
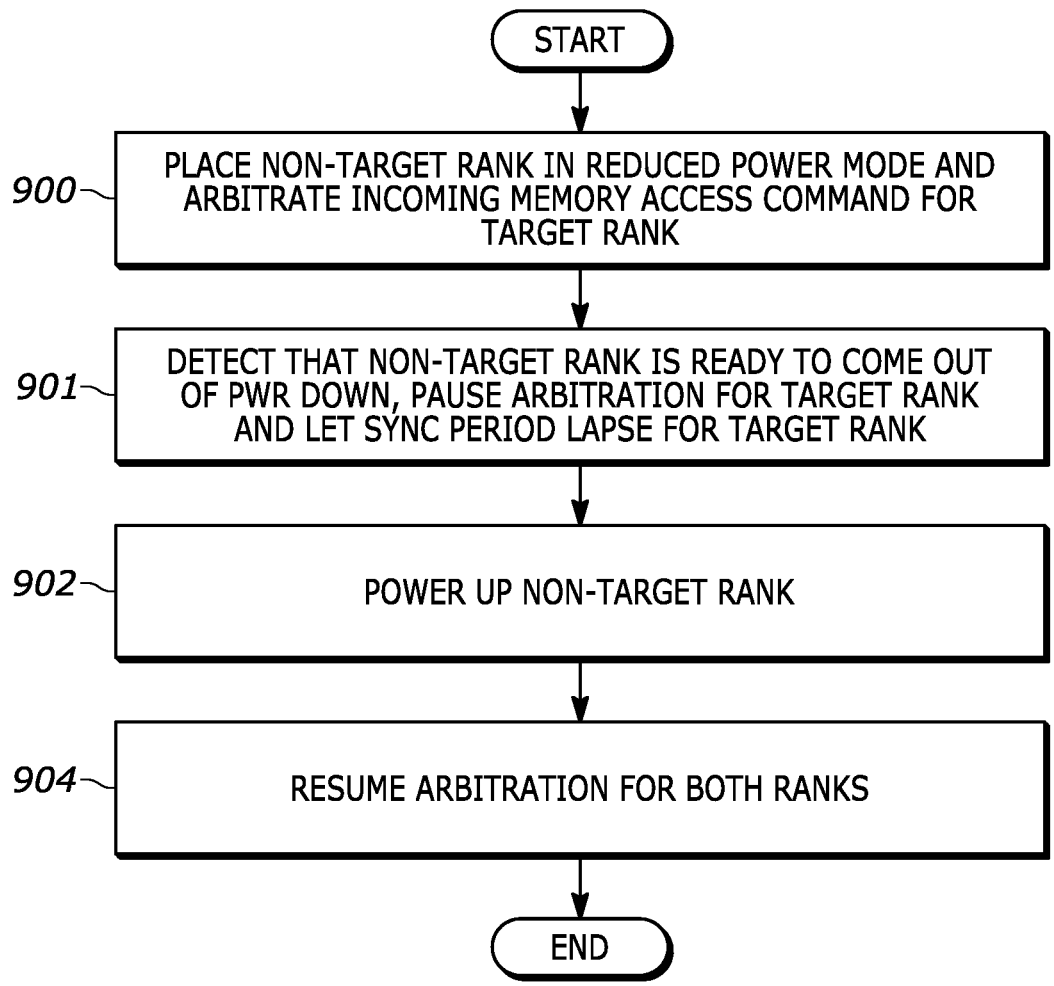
FIG. 9 is a flowchart illustrating one example of a method for powering up one or more of a plurality of double data rate memory ranks that share a data transfer clock in accordance with one example set forth in the disclosure.

FIG. 9 illustrates an example of powering up a currently powered down memory rank during an on-demand mode. The method includes, as shown in block 900, detecting when the currently powered down memory rank is to come out of a reduced power state. In one example, the control logic 502, upon receiving an incoming memory access command, detects that the incoming access command is destined for the memory address space of the currently powered down memory rank. However any suitable mechanism can be used to determine that a power up operation must occur. The method includes pausing the arbitration of the incoming memory access commands destined for the target DDR memory rank while the non-target DDR memory rank is in the reduced power mode and allowing the current target DDR memory rank to come out of synchronization. In one example, this includes the control logic letting the synchronization from the last synchronization command lapse that was sent to the target DDR memory rank. As shown in block 902, the method includes removing the non-target DDR memory rank from the reduced power mode, such as by powering up the non-target DDR memory rank using the power engine. As shown in block 904, the method includes resuming the arbitrating among the incoming memory access commands to determine a winning access command which in turn determines which rank is the target rank. Once the target rank is determined the synchronization process as described above for example with respect to FIGS. 3, 6 and 8 is performed.

It will be recognized that the examples provided herein are merely examples. For example, the order of the operations may be changed and that although a certain number of components are shown, any suitable number can be employed, also operations can be combined as desired. For example, additional DRAM ranks may be connected to the physical layer interface circuit 406 that employ the shared bus structure 132. Alternatively, an additional physical layer interface and memory controller as well as corresponding plurality of DDR memory ranks connected to the additional physical layer interface may also be employed to add additional memory capacity. Accordingly, it is intended by the appended claims to cover all modifications of the disclosed embodiments that fall within the scope of the disclosed embodiments.

Although features and elements are described above in particular combinations, each feature or element can be used alone without the other features and elements or in various combinations with or without other features and elements. The apparatus described herein in some implementations are manufactured by using a computer program, software, or firmware incorporated in a non-transitory computer-readable storage medium for execution by a general-purpose computer or a processor. Examples of computer-readable storage mediums include a read only memory (ROM), a random-access memory (RAM), a register, cache memory, semiconductor memory devices, magnetic media such as internal hard disks and removable disks, magneto-optical media, and optical media such as CD-ROM disks, and digital versatile disks (DVDs).

In the preceding detailed description of the various embodiments, reference has been made to the accompanying drawings which form a part thereof, and in which is shown by way of illustration specific preferred embodiments in which the invention may be practiced. These embodiments are described in sufficient detail to enable those skilled in the art to practice the invention, and it is to be understood that other embodiments may be utilized, and that logical, mechanical and electrical changes may be made without departing from the scope of the invention. To avoid detail not necessary to enable those skilled in the art to practice the invention, the description may omit certain information known to those skilled in the art. Furthermore, many other varied embodiments that incorporate the teachings of the disclosure may be easily constructed by those skilled in the art. Accordingly, the present invention is not intended to be limited to the specific form set forth herein, but on the contrary, it is intended to cover such alternatives, modifications, and equivalents, as can be reasonably included within the scope of the invention. The preceding detailed description is, therefore, not to be taken in a limiting sense, and the scope of the present invention is defined only by the appended claims. The above detailed description of the embodiments and the examples described therein have been presented for the purposes of illustration and description only and not by limitation. For example, the operations described are done in any suitable order or manner. It is therefore contemplated that the present invention covers any and all modifications, variations or equivalents that fall within the scope of the basic underlying principles disclosed above and claimed herein.

The above detailed description and the examples described therein have been presented for the purposes of illustration and description only and not for limitation.

What is claimed is:

1. A method for synchronizing a plurality of double data rate (DDR) memory ranks comprising:
   determining when a target DDR memory rank is out of synchronization with respect to a shared data transfer clock and a memory clock, wherein the shared data transfer clock is coupled as shared among the target DDR memory clock and a non-target DDR memory rank;
   in response to determining that the target DDR memory rank is out of synchronization with respect to the shared data transfer clock and the memory clock, determining whether the non-target DDR memory rank is out-of-synchronization with respect to the shared data transfer clock and the memory clock; and
   issuing a data transfer clock synchronization command to the target DDR memory rank in response to determining that the non-target DDR memory rank is out-of-synchronization with respect to the shared data transfer clock and the memory clock.

2. The method of claim 1 comprising:
   in response to determining that the target double data rate memory rank is out of synchronization, determining whether the non-target double data rate memory rank is in synchronization with the memory clock; and
   in response to determining that the non-target double data rate memory rank is in synchronization with the memory clock, determining a rank synchronization switch occasion for the non-target double data rate memory rank indicating a transition from an in-synchronization condition to an out-of-synchronization condition with the memory clock; and
   issuing the data transfer clock synchronization command to the target double data rate memory rank in response to determining the rank synchronization switch occasion for the non-target double data rate memory rank.

3. The method of claim 1 comprising:
   maintaining a unified synchronization counter for each of the target double data rate memory rank and the non-target double data rate memory rank; and
   issuing the data transfer clock synchronization command based on the maintained unified synchronization counter for each memory rank.

4. The method of claim 1 comprising:
   maintaining a read synchronization counter and a write synchronization counter for each of the target double data rate memory rank and the non-target double data rate memory rank; and
   issuing the data transfer clock synchronization command based on the maintained read synchronization counter and the write synchronization counter for each of the target double data rate memory rank and the non-target double data rate memory rank.

5. The method of claim 1 comprising:
   placing the non-target DDR memory rank in a reduced power mode;
   arbitrating among incoming memory access commands destined for the target DDR memory rank while the non-target DDR memory rank is in the reduced power mode;
   detecting that the non-target DDR memory rank is required to come out of the reduced power mode;
   pausing the arbitrating among incoming memory access commands destined for the target DDR memory rank;
   letting the target DDR memory rank become out-of-synchronization;
   removing the non-target DDR memory rank from the reduced power mode; and
   resuming the arbitrating among incoming memory access commands destined for the target DDR memory rank.

6. The method of claim 1 comprising providing the shared data transfer clock to the target double data rate (DDR) memory rank and the non-target DDR memory rank.

7. A device comprising:
   a memory controller operative to:
     process incoming memory access commands destined for at least one of a plurality of double data rate memory ranks;
     determine when a target DDR memory rank is out of synchronization with respect to a shared data transfer clock and a memory clock;
     in response to determining that the target DDR memory rank is out of synchronization with respect to the shared data transfer clock and the memory clock, determine whether the non-target DDR memory rank is out-of-synchronization with respect to the shared data transfer clock and the memory clock; and
     issue a data transfer clock synchronization command to the target DDR memory rank in response to determining that the non-target DDR memory rank is out-of-synchronization with respect to the shared data transfer clock and the memory clock.

8. The device of claim 7 wherein the memory controller is operative to:
   in response to determining that the target double data rate memory rank is out of synchronization, determine whether the non-target double data rate memory rank is in synchronization with the memory clock; and in response to determining that the non-target double data rate memory rank is in synchronization with the memory clock, determine a rank synchronization switch occasion for the non-target double data rate memory rank indicating a transition from an in-synchronization condition to an out-of-synchronization condition with the memory clock; and issue the data transfer clock synchronization command to the target double data rate memory rank in response to determining the rank synchronization switch occasion for the non-target double data rate memory rank.

9. The device of claim 7 comprising a physical layer interface circuit, operatively coupled to the memory controller, and configured to provide the shared data transfer clock signal to both the non-target double data rate memory rank and the target double data rate memory rank.

10. The device of claim 7 wherein the control logic is operative to maintain a unified synchronization counter for each of the target double data rate memory rank and the non-target double data rate memory rank and issue the data transfer clock synchronization command based on the maintained unified synchronization counter for each memory rank.

11. The device of claim 7 wherein the control logic is operative to maintain a read synchronization counter and a write synchronization counter for each of the target double data rate memory rank and the non-target double data rate memory rank and issue the data transfer clock synchronization command based on the maintained read synchronization counter and the write synchronization counter for each of the target double data rate memory rank and the non-target double data rate memory rank.

12. The device of claim 7 wherein the memory controller is operative to:
place the non-target DDR memory rank in a reduced power mode;
arbitrate among incoming memory access commands destined for the target DDR memory rank while the non-target DDR memory rank is in the reduced power mode;
detect that the non-target DDR memory rank is required to come out of the reduced power mode;
pause the arbitrating among incoming memory access commands destined for the target DDR memory rank;
let the target DDR memory rank become out of synchronization;
remove the non-target DDR memory rank from the reduced power mode; and
resume the arbitrating among incoming memory access commands destined for the target DDR memory rank.

13. The device of claim 9 comprising the non-target double data rate memory rank and the target double data rate memory rank each operatively coupled to the physical layer interface circuit and each coupled to receive the shared data transfer signal from the physical layer interface circuit and wherein the physical layer interface circuit is further configured to provide a memory bus that provides the memory clock and the data transfer clock synchronization command.

14. The device of claim 12 wherein the non-target double data rate memory rank and the target double data rate memory rank each include reduced power double data rate memory.

15. The device of claim 11 comprising the read synchronization counter and the write synchronization counter corresponding for each of the target double data rate memory rank and the non-target double data rate memory rank.

16. The device of claim 14 further comprising a control register configured to store data representing a synchronization timing count value for each read synchronization counter and write synchronization counter.

17. A device comprising:
a plurality of double data rate (DDR) memory ranks comprising at least a non-target double data rate memory rank and a target double data rate memory rank;
a physical layer interface circuit, operatively coupled to the non-target double data rate memory rank and the target double data rate memory rank, and configured to provide a shared data transfer clock signal to both the non-target double data rate memory rank and the target double data rate memory rank and to provide a shared memory clock;
a memory controller, operatively coupled to the physical layer interface circuit, and operative to:
process incoming memory access commands destined for at least one of a plurality of double data rate memory ranks;
determine when the target DDR memory rank is out of synchronization with respect to the shared data transfer clock and the memory clock;
in response to determining that the target DDR memory rank is out of synchronization with respect to the shared data transfer clock and the memory clock, determine whether the non-target DDR memory rank is out-of-synchronization with respect to the shared data transfer clock and the memory clock; and
issue a data transfer clock synchronization command to the target DDR memory rank in response to determining that the non-target DDR memory rank is out-of-synchronization with respect to the shared data transfer clock and the memory clock.

18. The device of claim 17 wherein the memory controller is operative to:
in response to determining that the target double data rate memory rank is out of synchronization, determine whether the non-target double data rate memory rank is in synchronization with the memory clock; and
in response to determining that the non-target double data rate memory rank is in synchronization with the memory clock, determine a rank synchronization switch occasion for the non-target double data rate memory rank indicating a transition from an in-synchronization condition to an out-of-synchronization condition with the memory clock; and
issue the data transfer clock synchronization command to the target double data rate memory rank in response to determining the rank synchronization switch occasion for the non-target double data rate memory rank.

19. The device of claim 17 comprising a unified synchronization counter per memory rank wherein the memory controller is operative to maintain the unified synchronization counter for each of the target double data rate memory rank and the non-target double data rate memory rank and issue the data transfer clock synchronization command based on the maintained unified synchronization counter for each memory rank.

20. The device of claim 19 wherein the memory controller is operative to:
place the non-target DDR memory rank in a reduced power mode;

arbitrate among incoming memory access commands destined for the target DDR memory rank while the non-target DDR memory rank is in the reduced power mode;

detect that the non-target DDR memory rank is required to come out of the reduced power mode;

pause the arbitrating among incoming memory access commands destined for the target DDR memory rank;

let the target DDR memory rank become out of synchronization;

remove the non-target DDR memory rank from the reduced power mode; and resume the arbitrating among incoming memory access commands destined for the target DDR memory rank.

21. The device of claim 17 wherein the physical layer interface circuit is configured to provide a memory bus that provides the memory clock, the data transfer clock synchronization command and the shared data transfer clock signal.

22. The device of claim 19 wherein the non-target double data rate memory rank and the target double data rate memory rank each comprise a reduced power double data rate memory.

\* \* \* \* \*